US010853240B2

(12) United States Patent
Byun

(10) Patent No.: US 10,853,240 B2
(45) Date of Patent: Dec. 1, 2020

(54) MEMORY SYSTEM FOR PERFORMING A DIFFERENT PROGRAM OPERATION BASED ON A SIZE OF DATA AND AN OPERATING METHOD THEREOF

(71) Applicant: SK hynix Inc., Gyeonggi-do (KR)

(72) Inventor: Eu-Joon Byun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/389,418

(22) Filed: Apr. 19, 2019

(65) Prior Publication Data

US 2020/0089605 A1 Mar. 19, 2020

(30) Foreign Application Priority Data

Sep. 19, 2018 (KR) .................. 10-2018-0112171

(51) Int. Cl.
*G06F 12/02* (2006.01)
*G11C 7/10* (2006.01)

(52) U.S. Cl.
CPC ........ *G06F 12/0246* (2013.01); *G11C 7/1006* (2013.01); *G11C 7/1084* (2013.01); *G11C 2207/2245* (2013.01)

(58) Field of Classification Search
CPC .. G06F 12/0246; G06F 3/0658; G06F 3/0656; G06F 3/0688; G11C 7/1006; G11C 7/1084; G11C 2207/2245; G11C 11/5628; G11C 16/0483; G11C 5/04; G11C 16/10
USPC ................ 711/103, 154, 118, 127, 170, 171; 365/185.33, 230.04
See application file for complete search history.

(56) References Cited

U.S. PATENT DOCUMENTS

| 9,734,050 | B2* | 8/2017 | Sinclair | G06F 12/0246 |
|---|---|---|---|---|
| 2012/0036316 | A1* | 2/2012 | Dowling | G06F 9/30032 |
| | | | | 711/105 |
| 2012/0198132 | A1* | 8/2012 | Han | G11C 11/5628 |
| | | | | 711/103 |
| 2013/0151776 | A1* | 6/2013 | Edelhaeuser | G06F 12/02 |
| | | | | 711/118 |
| 2016/0378379 | A1* | 12/2016 | Sinclair | G06F 12/0246 |
| | | | | 711/103 |
| 2017/0177235 | A1* | 6/2017 | Nishikubo | G06F 3/0611 |
| 2019/0018613 | A1* | 1/2019 | Byun | G06F 3/0679 |

(Continued)

FOREIGN PATENT DOCUMENTS

| KR | 10-2015-0102030 | 9/2015 |
|---|---|---|
| KR | 10-2016-0050393 | 5/2016 |

*Primary Examiner* — Hong C Kim
(74) *Attorney, Agent, or Firm* — IP & T Group LLP

(57) ABSTRACT

A memory system may include: a memory device including a plurality of dies; and a controller suitable for controlling the memory device, wherein the controller includes: a buffer including a plurality of entries suitable for temporarily storing target data; a monitor suitable for comparing a size of the target data with a predetermined threshold value; a buffer manager suitable for determining, when the size of the target data is equal to or greater than the predetermined threshold value, a skip value based on physical information of the memory device, and storing a start entry and an end entry in which the target data is stored; and a processor suitable for controlling the memory device to perform a program operation on the target data through an interleaving programming method based on the start entry, the end entry, and the skip value.

20 Claims, 14 Drawing Sheets

(56) References Cited

U.S. PATENT DOCUMENTS

| | | | |
|---|---|---|---|
| 2019/0303292 A1* | 10/2019 | Byun | G06F 12/0607 |
| 2020/0026472 A1* | 1/2020 | Song | G06F 13/382 |
| 2020/0026646 A1* | 1/2020 | Lee | G06F 12/0804 |
| 2020/0042180 A1* | 2/2020 | Byun | G06F 3/0679 |

* cited by examiner

MEMORY SYSTEM FOR PERFORMING A DIFFERENT PROGRAM OPERATION BASED ON A SIZE OF DATA AND AN OPERATING METHOD THEREOF

CROSS-REFERENCE TO RELATED APPLICATIONS

The present application claims priority under 35 U.S.C. § 119(a) to Korean Patent Application No. 10-2018-0112171, filed on Sep. 19, 2018, the disclosure of which is incorporated herein by reference in its entirety.

BACKGROUND

1. Field

Various embodiments of the present invention generally relate to a memory system, and more particularly, the embodiments relate to a memory system capable of efficiently reading data, and an operating method thereof.

2. Description of the Related Art

The computer environment paradigm has shifted towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory unit or an auxiliary memory unit of a portable electronic device.

Since there is no mechanical driving part, a data storage device using a memory device provides advantages such as excellent stability and durability, high information access speed, and low power consumption. Also, the data storage device can have a higher data access rate and lowerpower consumption than a hard disk device. Non-limiting examples of the data storage device having such advantages include Universal Serial Bus (USB) memory devices, memory cards of diverse interfaces, Solid-State Drives (SSD) and the like.

SUMMARY

Various embodiments of the present invention are directed to a memory system capable of efficiently programing data to a memory device based on a size of the data.

In accordance with an embodiment of the present invention, a memory system may include: a memory device including a plurality of dies; and a controller suitable for controlling the memory device, wherein the controller includes: a buffer including a plurality of entries suitable for temporarily storing target data; a monitor suitable for comparing a size of the target data with a predetermined threshold value; a buffer manager suitable for determining, when the size of the target data is equal to or greater than the predetermined threshold value, a skip value based on physical information of the memory device, and storing a start entry and an end entry in which the target data is stored; and a processor suitable for controlling the memory device to perform a program operation on the target data through an interleaving programming method based on the start entry, the end entry, and the skip value.

In accordance with an embodiment of the present invention, an operating method of a memory system with a controller and a memory device including a plurality of dies, may include: temporarily storing target data a plurality of entries included in a buffer; storing a start entry and an end entry in which the target data is stored, among the plurality of entries; comparing a size of the target data with a predetermined threshold value; determining a skip value based on physical information of the memory device when the size of the target data is equal to or greater than a predetermined threshold value; and programming the target data through a interleaving programming method based on the start entry, the end entry, and the skip value.

In accordance with an embodiment of the present invention, a memory system may include: a memory device including a plurality of dies; and a controller suitable for controlling the memory device, wherein the controller includes: a plurality of entries suitable for temporarily storing target data to be programmed into the plurality of dies of the memory device; a monitor suitable for determining a size of the target data; a buffer manager suitable for storing a start entry and an end entry in which the target data is stored; and a processor suitable for controlling the memory device to perform a program operation on the target data through an interleaving programming method or a sequential method based on the start entry, the end entry.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
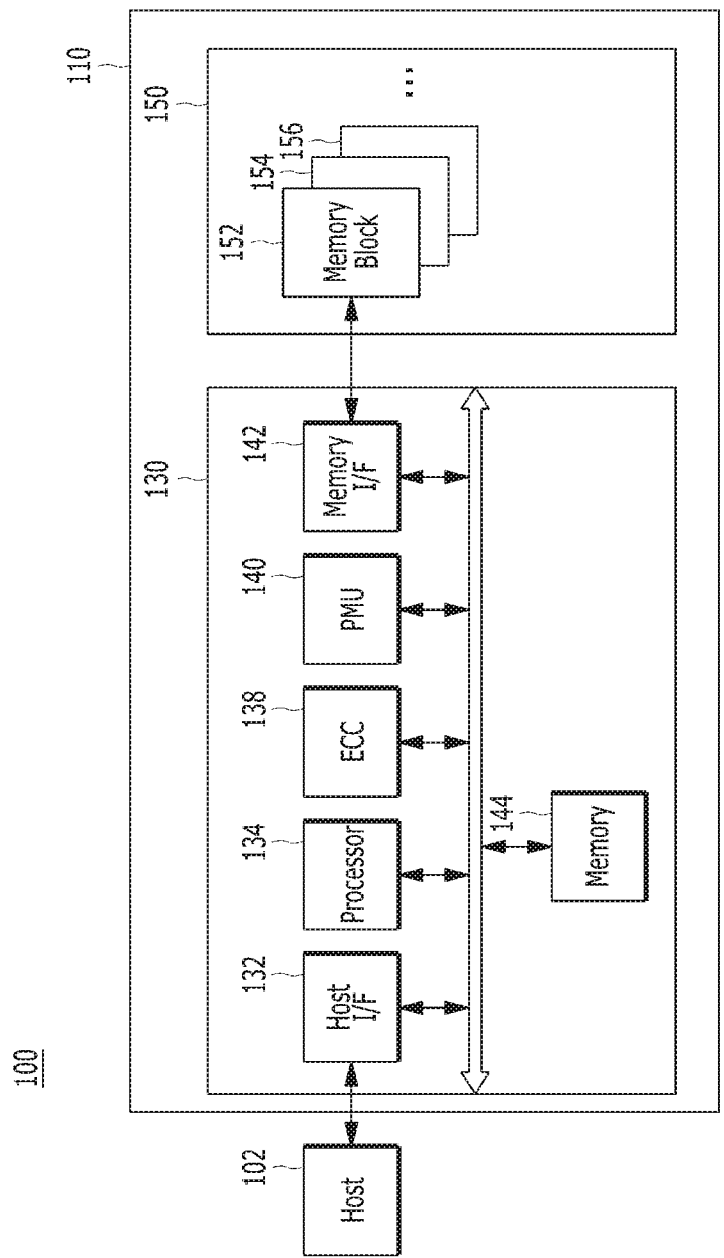
FIG. 1 is a block diagram illustrating a data processing system including a memory system in accordance with an embodiment of the present disclosure.

Various examples of the disclosure are described below in more detail with reference to the accompanying drawings. The disclosure may be embodied in different other embodiments, forms and variations thereof and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure. It is noted that reference to "an embodiment," "another embodiment or the like does not necessarily mean only one embodiment, and different references to any such phrases are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. For example, a first element in one instance could also be termed as a second or third element in another instance, and vice versa, without departing from the spirit and scope of the present disclosure.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless the context indicates otherwise.

The terminology used herein is for the purpose of describing particular embodiments only and is not intended to be limiting of the present invention.

As used herein, singular forms are intended to include the plural forms and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Various embodiments of the present disclosure are merely for the purpose of understanding the present invention, not limiting it. Various modifications of the disclosed embodiments that fall within the spirit and scope of the present disclosure will be apparent to those skilled in the art.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled to the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such, for example, as a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even when power is not supplied. The memory device 150 may store data provided from the host 102 through a write operation, and provide data stored therein to the host 102 through a read operation. The memory device 150 may include a plurality of memory blocks (for example, memory blocks 152 to 156 shown in FIG. 1), each of the memory blocks may include a plurality of pages. Each of the plurality of pages may include a plurality of memory cells to which a plurality of word lines (WL) are electrically coupled.

The controller 130 may control overall operations of the memory device 150, such as read, write, program and erase operations. For example, the controller 130 may control the memory device 150 in response to a request from the host 102. The controller 130 may provide the data, read from the memory device 150, with the host 102, and/or may store the data, provided by the host 102, into the memory device 150.

The controller 130 may include a host interface (I/F) 132, a processor 134, an error correction code (ECC) component 138, a power management unit (PMU) 140, a memory interface (I/F) 142, and a memory 144, all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The ECC component 138 may detect and correct errors in the data read from the memory device 150 during the read operation. When the number of the error bits is greater than or equal to a threshold number of correctable error bits, the ECC component 138 may not correct error bits but may output an error correction fail signal indicating failure in correcting the error bits.

The ECC component 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC component 138 may include all or some of circuits, modules, systems or devices for performing the error correction operation based on at least one of the above described codes.

The PMU 140 may provide and manage power for the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory and, in particular, when the memory device 150 is a NAND flash memory.

The memory 144 may serve as a working memory for the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used as a buffer to store data required for the controller 130 and the memory device 150 in order to perform these operations.

The memory 144 may be implemented with a volatile memory. For example, the memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the cont oiler 130. For instance, the memory 144 may be embodied by an external volatile memory having a memory interface transferring data and/or signals transferred between the memory 144 and the controller 130.

The processor 134 may be implemented with a microprocessor or a central processing unit (CPU). The memory system 110 may include one or more processors 134.

Figure 2:
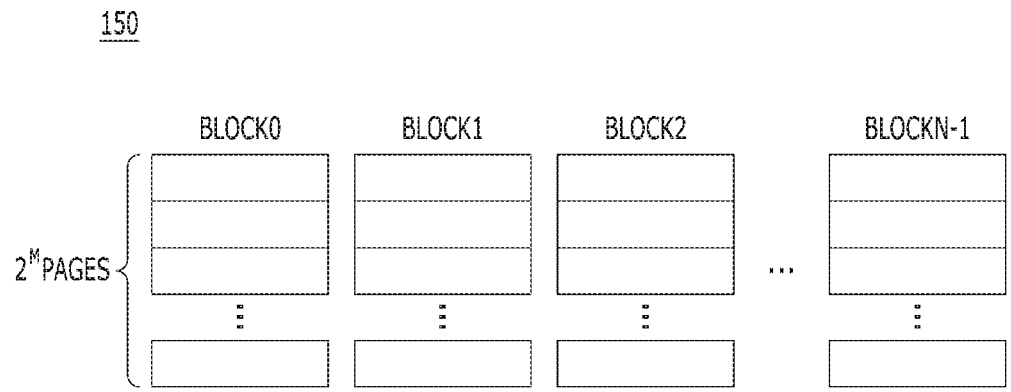
FIG. 2 is a schematic diagram illustrating a configuration of a memory device of the memory system shown in FIG. 1 in accordance with an embodiment.

FIG. 2 is a schematic diagram illustrating a memory device, such as the memory device 150 shown in FIG. 1.

Referring to FIG. 2, the memory device 150 may include the plurality of memory blocks BLOCK0 to BLOCKN−1, and each of the blocks BLOCK0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block. An MLC memory block including a plurality of pages which are implemented with memory cells that are each capable of storing 4-bit data may be defined as a quad level cell (QLC) memory block.

Figure 3:
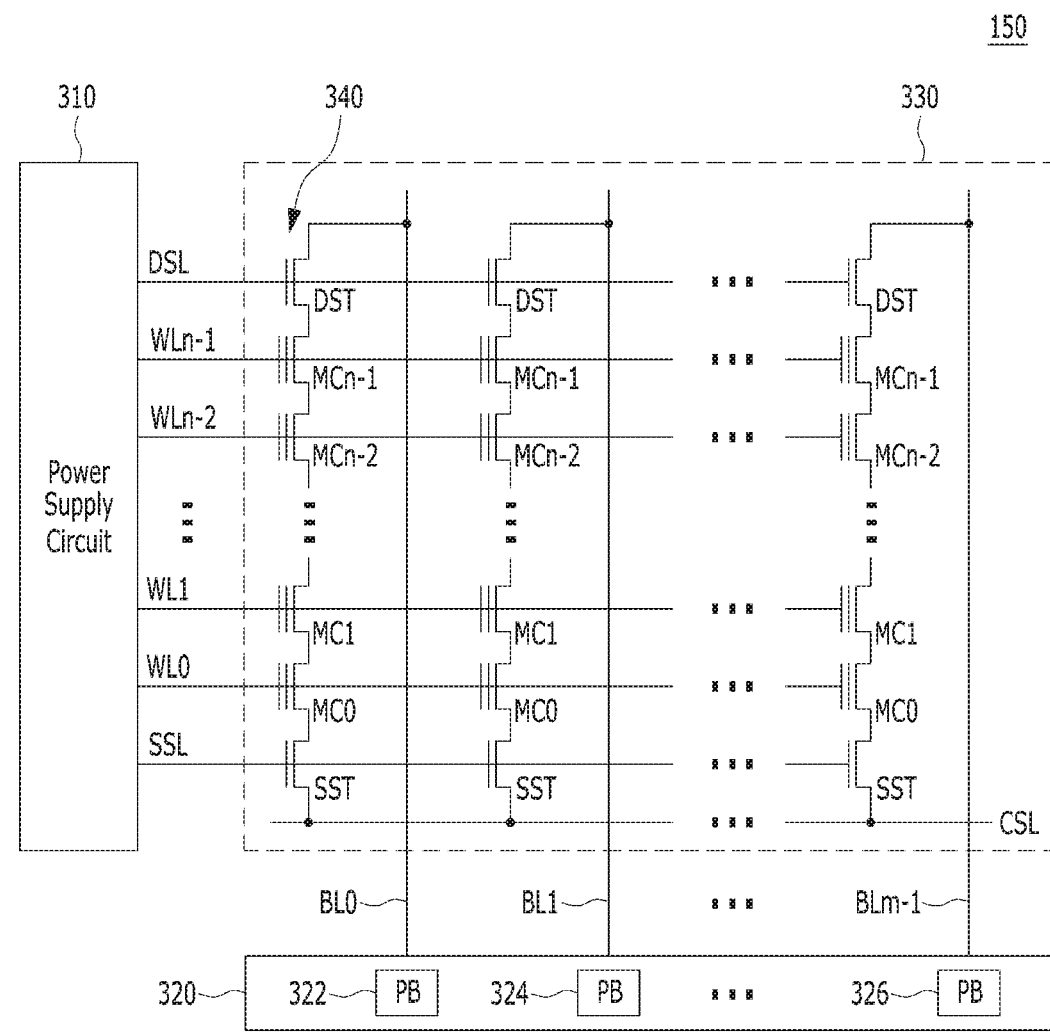
FIG. 3 is a circuit diagram illustrating a configuration of a memory cell array of a memory block in the memory device shown in FIG. 2 in accordance with an embodiment.

FIG. 3 is a circuit diagram illustrating a memory block 330 in a memory device, such as the memory device 150 shown in FIG. 2.

Referring to FIG. 3, the memory block 330 may correspond to any one among the plurality of memory blocks 152 to 156 included in the memory device 150 of the memory system 110 shown in FIG. 1.

Referring to FIG. 3, the memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. However, the present invention is not limited to just the SLC or MLC. The strings 340 may be electrically coupled to the corresponding bit lines BL0 to BLm−1, respectively. For reference, in FIG. 3, 'DSC' denotes a drain select line, 'SSC' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to just a NAND flash memory. Depending on an embodiment, the memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
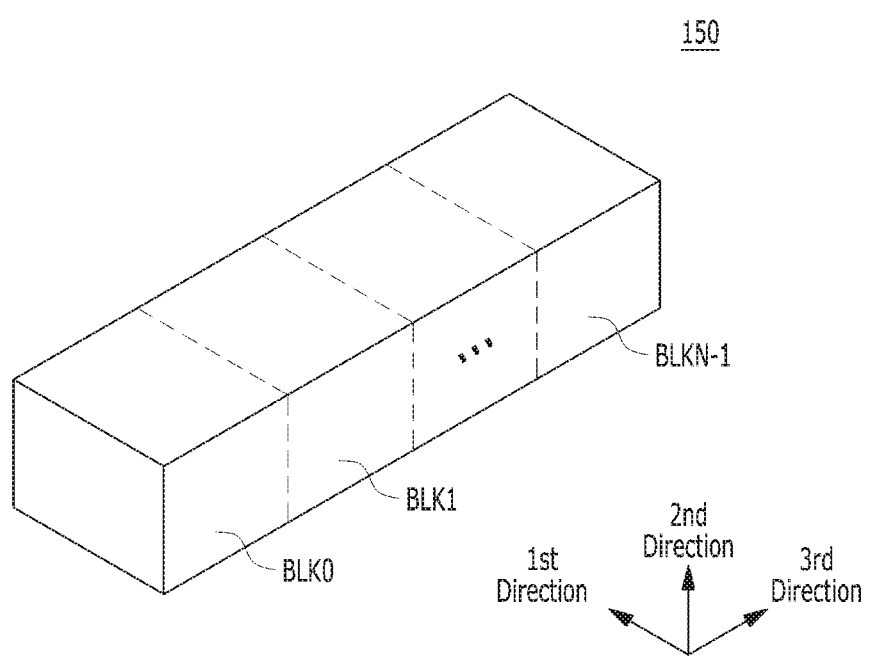
FIG. 4 is a schematic diagram illustrating a three-dimensional (3D) structure of the memory device shown in FIG. 2 in accordance with an embodiment.

FIG. 4 is a schematic diagram illustrating a 3D structure of a memory device, such as the memory device 150 shown in FIG. 2.

Although FIG. 4 shows a 3D structure, the memory device 150 may be embodied by a two-dimensional (2D) or three-dimensional (3D) memory device. Specifically, as illustrated in FIG. 3, the memory device 150 may be embodied in a nonvolatile memory device having a 3D stack structure. When the memory device 150 has a 3D structure, the memory device 150 may include a plurality of memory blocks BLK0 to BLKN−1 each having a 3D structure (or a vertical structure).

Referring to FIGS. 2 to 4, the memory device 150 may include a plurality of channels, and each of the channels may have a plurality of dies coupled thereto. Each of the dies may include a plurality of blocks, each of which may include a plurality of pages.

The processor 134 may program a write data (which is, hereinafter, referred to as a target data) provided from the host 102 into the memory device 150. Herein, the processor 134 may program the target data into each of the dies, the blocks, and the pages through several methods. Each of the program methods may have different advantages and disadvantages. In particular, when the target data is sequential data, the different advantages and disadvantages of each of the program methods may be more outstanding. The memory system 110 in accordance with the embodiment of the present invention may efficiently program the target data into the memory device 150 by using the program methods.

Figure 5:
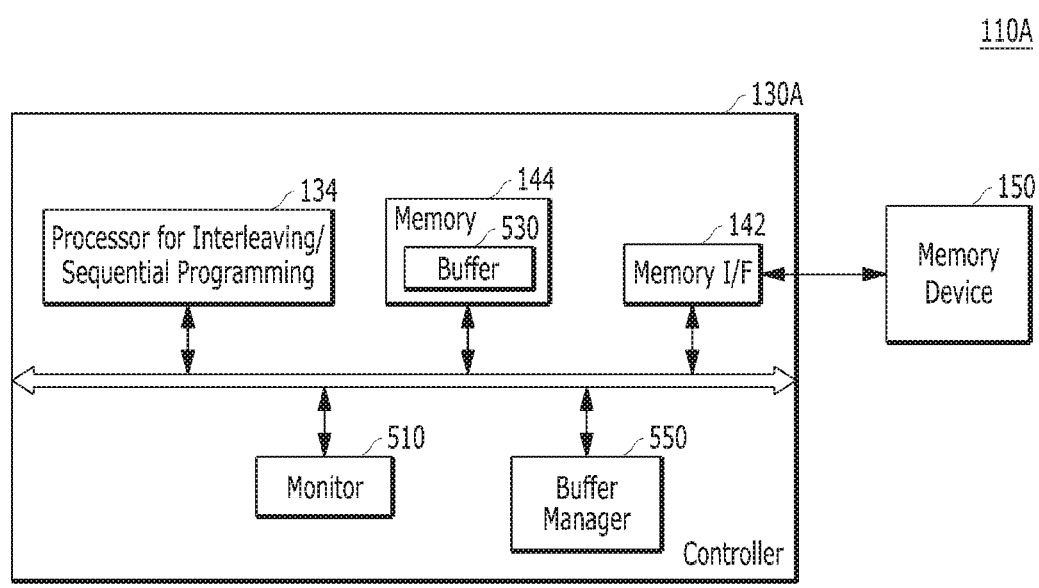
FIG. 5 is a block diagram illustrating a memory system in accordance with an embodiment of the present disclosure.

FIG. 5 is a block diagram illustrating a memory system 110A in accordance with an embodiment of the present invention. The memory system 110A may include a controller 130A and a memory device 150. The memory device 150 may have the same configuration as the memory device 150 shown in FIG. 1. The configuration shown in FIG. 5 is merely an example and only shows some of the elements, and elements may be replaced by any one of numerous equivalent alternatives, only some of which are disclosed in the specification.

The controller 130A may include a processor 134, a memory 144, and a memory interface 142, and the controller 130A may further include a monitor 510 and a buffer manager 550. Although FIG. 5 shows the monitor 510 and the buffer manager 550 as constituent elements separate from the processor 134, the monitor 510 and the buffer manager 550 may be embedded in the processor 134 according to another embodiment of the present invention. In other words, the processor 134 may perform the operations of the monitor 510 and the buffer manager 550. The processor 134, the memory 144, and the memory interface 142 may have the same configuration as those shown in FIG. 1. Furthermore, although not illustrated in FIG. 5, the controller 130A may further include the other elements shown in FIG. 1.

The controller 130A may receive a write request from the host 102, and then receive a write data (which is, hereinafter, referred to as a target data) corresponding to the write request from the host 102 through the host interface 132 shown FIG. 1.

The memory 144 may include a buffer 530 for temporarily storing data. The buffer 530 may include a plurality of entries in which data may be temporarily stored. Each of the entries may be equal to the size of one physical page or the size of one logical page included in the memory device 150.

The target data may be temporarily stored in the buffer 530 in the memory 144 under the control of the processor 134. To be specific, the processor 134 may assign the target data to each of the entries included in the buffer 530, and provide the buffer manager 550 with information on the entry to which the target data is assigned.

The monitor 510 may check the size of the target data. To be specific, the monitor 510 may detect the size of the target data based on the logical address (LBA) provided from the host 102, For example, when the size of the data corresponding to one LBA is '4 KB' and the host 102 requests the memory system 110A to write data corresponding to 12 LBAs, the monitor 510 may detect the size of the target data provided from the host 102 to be '48 KB'.

Also, the monitor 510 may compare the size of the target data with a predetermined threshold value. For example, the monitor 510 may compare the size of the target data with the size of the storage capacity of one strip in a super block. A strip denotes a group of physical pages positioned at the same offset in the same super block. The monitor 510 may provide the buffer manager 550 with the comparison result.

The buffer manager 550 may manage the buffer 530 in the memory 144. The buffer manager 550 may store information on a start entry and an end entry in which the target data are stored based on the information on the entries of the buffer 530 provided by the processor 134. The start entry denotes the first entry in which the target data are to be stored in the buffer 530. The end entry denotes the last entry in which the target data are to be stored in the buffer 530.

Furthermore, when the size of the target data is equal to or greater than the predetermined threshold value, the buffer manager 550 may set a skip value. The skip value denotes the difference in number between the entries corresponding to pages in the same die, which are used for an interleaving operation when the target data is programmed. For example, when it is assumed that the start entry is '1', the skip value is '4', and the data stored in a first entry of the buffer 530 is provided to the first die, the data stored in a fifth entry may be provided to the first die and not the second entry, since the skip value is '4'. The data stored in the fifth entry may be programmed into a page next to the page where the data stored in the first entry is programmed (i.e., an interleaving programming method).

The buffer manager 550 may determine the skip value based on the number of dies forming a super block and the number of blocks related to the super block in one die. For example, when the number of dies forming a super block is '4' and the number of blocks related to the super block in one die is '1', the buffer manager 550 may determine the skip value as '4'.

On the other hand, when the size of the target data is smaller than the predetermined threshold value, the buffer manager 550 may not determine the skip value. Thus, the target data stored in the buffer 530 may be provided sequentially to a die of the memory device 150. For example, when the data stored in the first entry of the buffer 530 is provided to the first die, the data stored in the second entry may be subsequently provided to the first die since there is no skip value (i.e., a sequential programming method).

The processor 134 may program the target data stored in the buffer 530 into the memory device 150. However, the processor 134 may program the memory device 150 through different programming methods based on the size of the target data stored in the buffer 530. Referring to FIGS. 6A to 7B, different programming methods may be described specifically.

FIGS. 6A to 7B are diagrams illustrating a programming method of the memory system 110A in accordance with an embodiment of the present invention.

For the sake of convenience in explanation, it is assumed in FIGS. 6A to 7B that a program operation is performed onto four dies, one plane in each die. It may be also assumed that the size of one page is '16 KB', and the size of data corresponding to one LBA provided from the host 102 is '4 KB'. It may be further assumed that the size of one entry in the buffer 530 is '4 KB'.

A super block described below may be formed of blocks each included in the respective dies. In other words, first memory blocks included in each of the first to fourth dies may form one super block. A super block may include a plurality of strips. Also, it is assumed that the predetermined threshold value described in FIG. 5 is the size of one strip. However, this is merely an embodiment, and the scope and spirit of the present invention are not limited thereto.

Figure 6A:
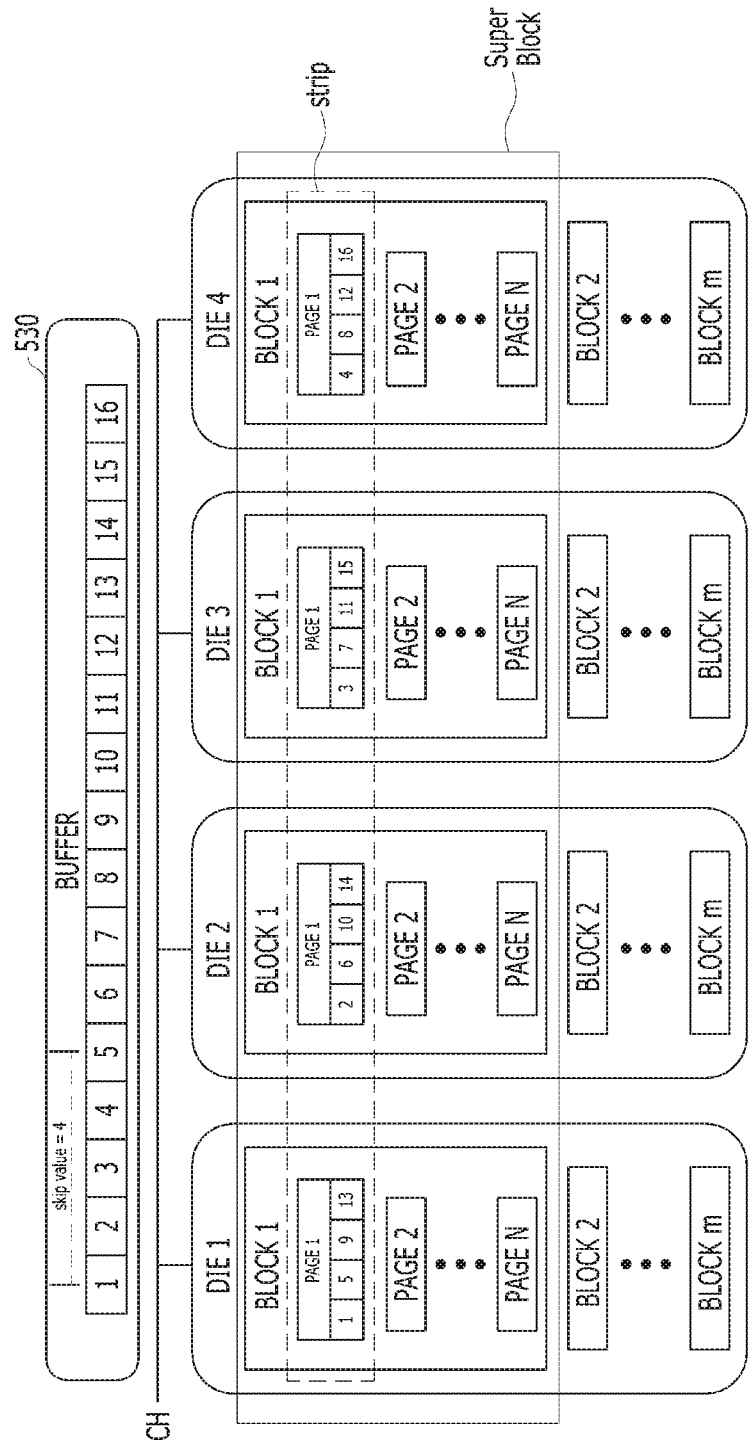
FIGS. 6A and 6B are diagrams illustrating a method of programming target data into an SLC memory block in the memory system in accordance with an embodiment of the present disclosure.
Figure 6B:
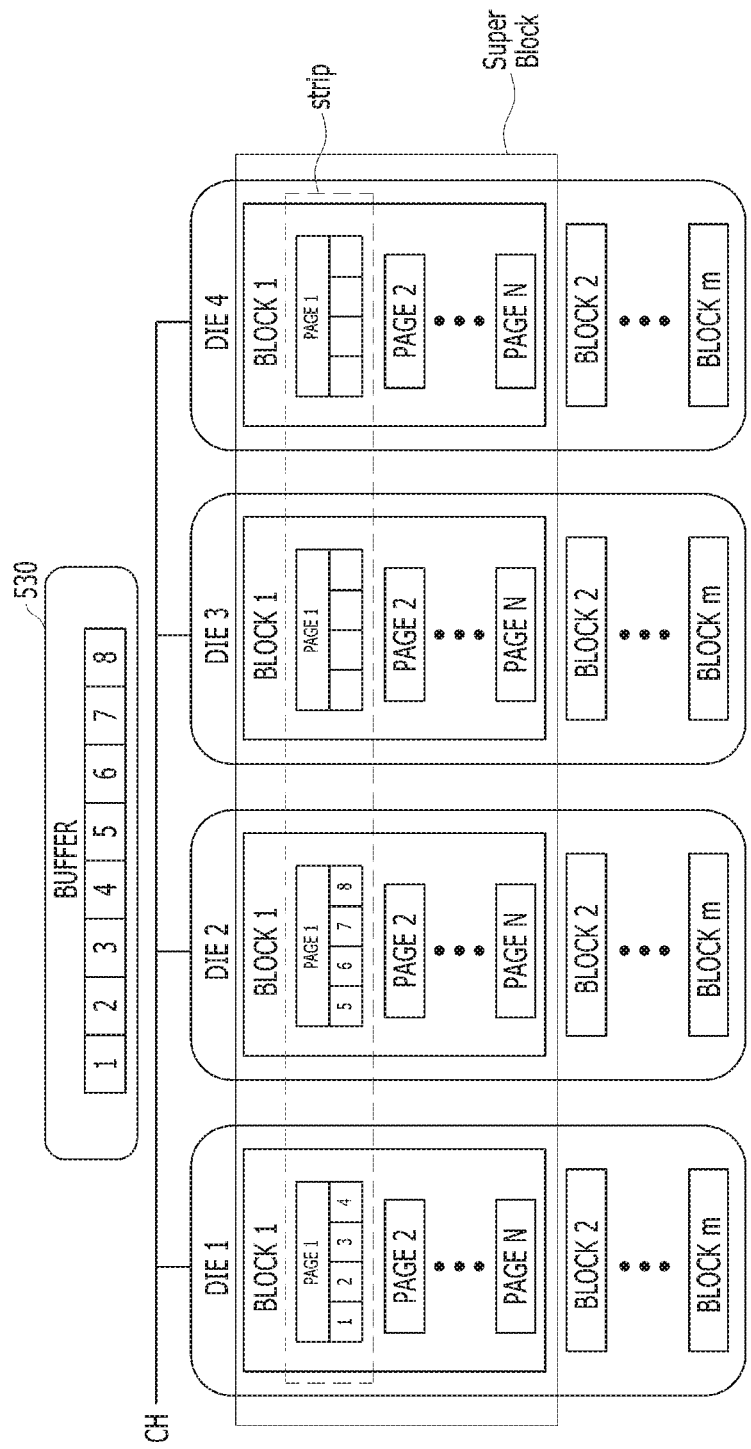

FIGS. 6A and 6B are diagrams illustrating a method of programming target data into an SLC memory block in the memory system 110A in accordance with an embodiment of the present invention. The programming method illustrated in FIG. 6A may be referred to as a first programming method, and the program method illustrated in FIG. 6B may be referred to as a second programming method.

First, referring to FIG. 6A, the host 102 may request the memory system 110A to perform a write operation for target data corresponding to 16 LBAs. The target data may then be temporarily stored in the buffer 530 in the memory 144 under the control of the processor 134. The target data may be assigned to 16 entries in the buffer 530, respectively, under the control of the processor 134.

The monitor 510 may detect the size of the target data to be '64 KB' based on the 16 LBAs provided by the host 102. The monitor 510 may then compare the size of the target data with the size of one strip. One strip may include four pages, and since the embodiment shown in FIG. 6A illustrates an SLC memory block, the size of the strip may be '64 KB'. Then, the monitor 510 may provide the buffer manager 550 with the comparison result (i.e., that the size of the target data is greater than or equal to the size of the predetermined threshold value).

The buffer manager 550 may store information on a start entry and an end entry in which the target data are stored. Referring to FIG. 6A, the start entry may be '1' and the end entry may be '16'. Also, since the size of the target data is equal to the size of one strip, the buffer manager 550 may determine the skip value. The buffer manager 550 may determine the skip value as '4', because '4' dies form one super block and the number of blocks related to the super block in each of the four dies is '1'. The buffer manager 550 may provide the processor 134 with the start entry, the end entry, and the skip value.

The processor 134 may program the target data based on the start entry, the end entry, and the skip value provided from the buffer manager 550. In particular, the processor 134 may program the target data stored in the buffer 530 into each of the pages forming a strip through an interleaving operation. For example, the processor 134 may control the memory device 150 to write the target data stored in a first entry into the first die, the target data stored in a second entry into the second die, the target data stored in a third entry into the third die, and the target data stored in a fourth entry into the fourth die. Since the skip value is '4', the processor 134 may control the memory device 150 to write the target data stored in a fifth entry into the first die, the target data stored in a sixth entry into the second die, the target data stored in a seventh entry into the third die, and the target data stored in an eighth entry into the fourth die. Based on the same principle, the processor 134 may program the memory device 150 with the target data from the target data stored in the first entry to the target data stored in the sixteenth entry.

On the other hand, referring to FIG. 6B, the host 102 may request the memory system 110A to perform a write operation for target data corresponding to eight LBAs. The target data may then be temporarily stored in the buffer 530 in the memory 144 under the control of the processor 134. The target data may be assigned to eight entries in the buffer 530, respectively, under the control of the processor 134.

The monitor 510 may detect the size of the target data to be '32 KB' based on the 8 LBAs provided by the host 102. The monitor 510 may then compare the size of the target data with the size of one strip. The size of the strip may be '64 KB'. The monitor 510 may then provide the buffer manager 550 with the comparison result (i.e., that the size of the target data is less than the size of the predetermined threshold value).

The buffer manager 550 may store information on a start entry and an end entry in which the target data are stored. Referring to FIG. 6B, the start entry may be '1' and the end entry may be '8'. Also, since the size of the target data is smaller than the size of one strip, the buffer manager 550 may not determine the skip value. The buffer manager 550 may provide the processor 134 with the start entry and the end entry.

The processor 134 may program the target data based on the start entry and the end entry provided from the buffer manager 550. In particular, the processor 134 may sequentially program the target data stored in the buffer 530 into the pages forming a strip. For example, the processor 134 may control the memory device 150 to program the target data stored in a first entry to a fourth entry sequentially into the first die. The processor 134 may then control the memory device 150 to program the target data stored in a fifth entry to an eighth entry sequentially into the second die. In short, the programming method described with reference to FIG. 6B may be a method of sequentially programming target data from the first die without using the interleaving method.

Figure 7A:
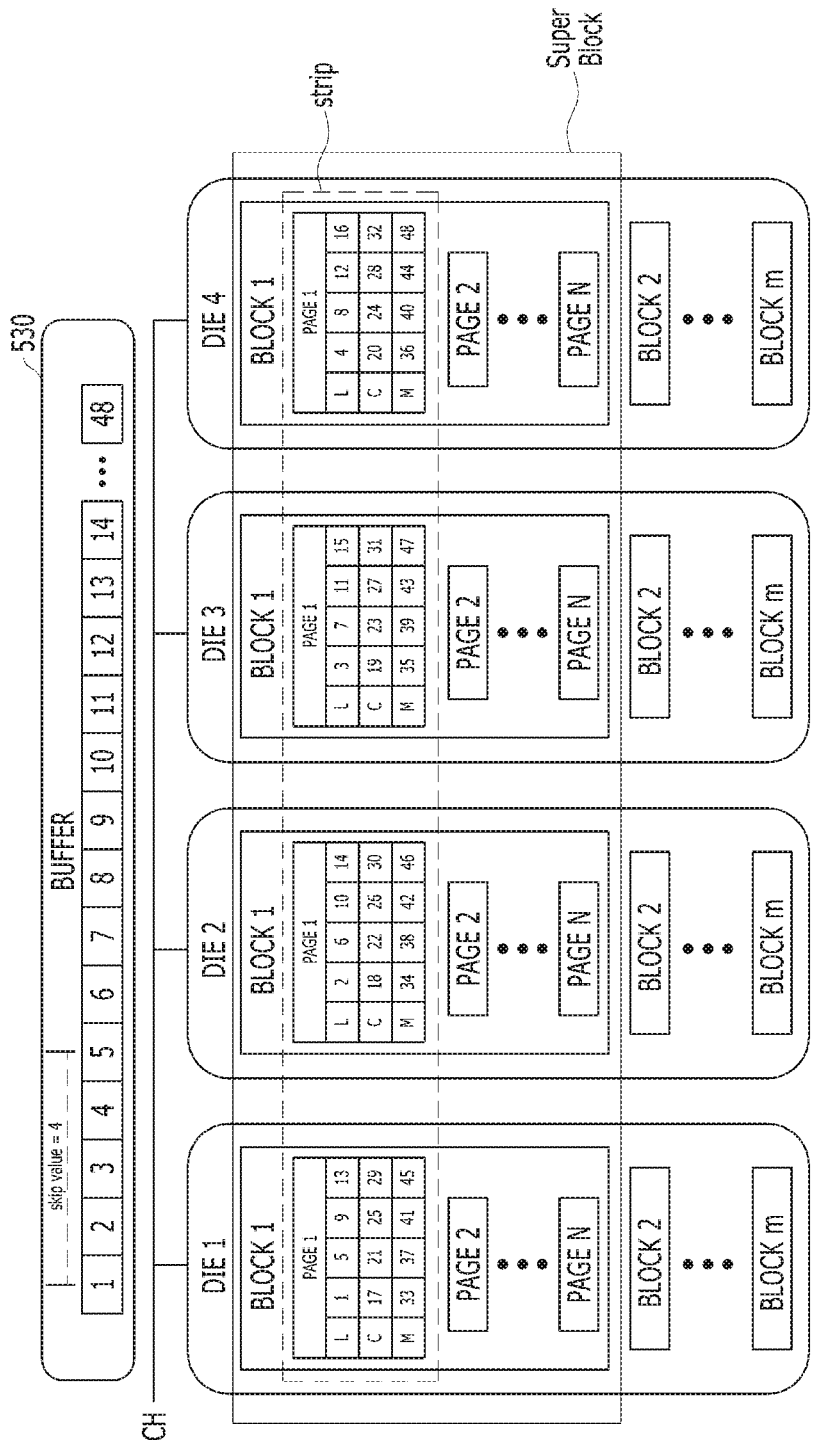
FIGS. 7A and 7B are diagrams illustrating a method of programming target data into a TLC memory block in the memory system in accordance with an embodiment of the present disclosure.
Figure 7B:
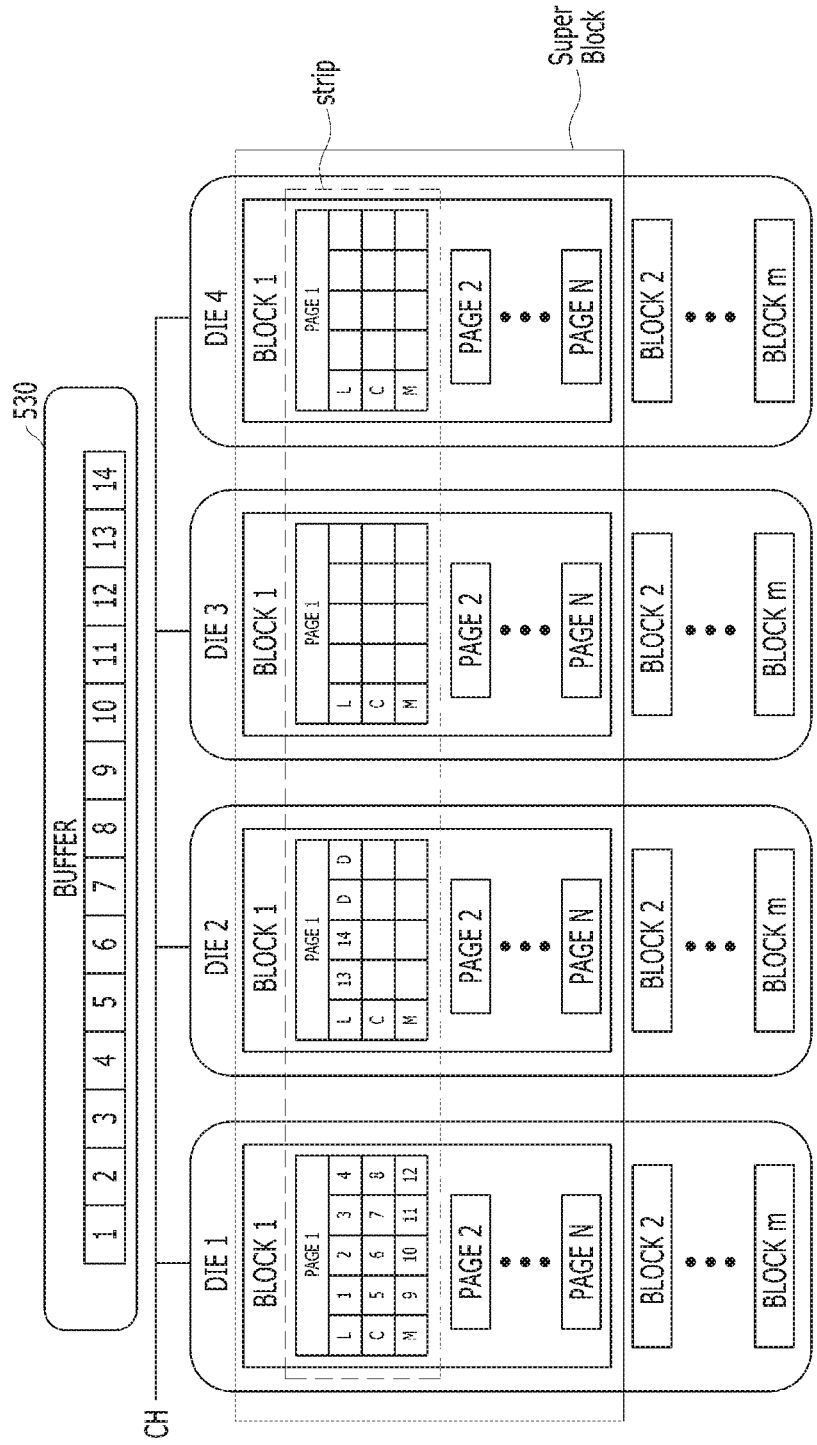

FIGS. 7A and 7B are diagrams illustrating a method of programming target data into a TLC memory block in the memory system 110A in accordance with an embodiment of the present invention. The programming method described in FIG. 7A may be referred to as a first programming method, and the programming method described in FIG. 7B may be referred to as a second programming method. In both FIGS. 7A and 7B, 'L' denotes the first logical page (LSB), 'C' denotes the second logical page (CSB), and 'M' denotes the third logical page (MSB).

First, referring to FIG. 7A, the host 102 may request the memory system 110A to perform a write operation for target data corresponding to 48 LBAs. The target data may then be temporarily stored in the buffer 530 in the memory 144 under the control of the processor 134. The target data may be assigned to 48 entries in the buffer 530, respectively, under the control of the processor 134.

The monitor 510 may detect the size of the target data to be '192 KB' based on the 48 LBAs provided by the host 102. The monitor 510 may then compare the size of the target data with the size of one strip. One strip may include four pages, and since the embodiment shown in FIG. 7A illustrates a TLC memory block, the size of the strip may be '192 KB'. In case of a TLC memory block, three logical pages may be included in one physical page, which is different from the SLC memory block. Therefore, although the size of a strip is '64 KB' in FIGS. 6A and 6B, the size of a strip in FIGS. 7A and 7B may be '192 KB'. Then, the monitor 510 may provide the buffer manager 550 with the comparison result (i.e., that the size of the target data is greater than or equal to the size of the predetermined threshold value).

The buffer manager 550 may store information on a start entry and an end entry in which the target data are stored. Referring to FIG. 7A, the start entry may be '1' and the end entry may be '48'. Also, since the size of the target data is equal to the size of one strip, the buffer manager 550 may determine the skip value. The buffer manager 550 may determine the skip value as '4', because '4' dies form one super block and the number of blocks related to the super block in each of the four dies is '1'. The buffer manager 550 may provide the processor 134 with the start entry, the end entry, and the skip value.

The processor 134 may program the target data based on the start entry, the end entry, and the skip value provided from the buffer manager 550. In particular, the processor 134 may program the target data stored in the buffer 530 into each of the pages forming a strip through an interleaving operation. For example, the processor 134 may control the memory device 150 to write the target data stored in a first entry into the first die, the target data stored in a second entry into the second die, the target data stored in a third entry into the third die, and the target data stored in a fourth entry into the fourth die. Since the skip value is '4', the processor 134 may control the memory device 150 to write the target data stored in a fifth entry into the first die, the target data stored in a sixth entry into the second die, the target data stored in a seventh entry into the third die, and the target data stored in an eighth entry into the fourth die. Based on the same principle, the processor 134 may program the memory device 150 with the target data from the target data stored in the first entry to the target data stored in the 48th entry.

On the other hand, referring to FIG. 7B, the host 102 may request the memory system 110A to perform a write operation for target data corresponding to 14 LBAs. The target data may then be temporarily stored in the buffer 530 in the memory 144 under the control of the processor 134. The target data may be assigned to 14 entries in the buffer 530, respectively, under the control of the processor 134.

The monitor 510 may detect the size of the target data to be '56 KB' based on the 14 LBAs provided by the host 102. The monitor 510 may then compare the size of the target data with the size of one strip. The size of the strip may be '64 KB'. The monitor 510 may then provide the buffer manager 550 with the comparison result (i.e., that the size of the target data is less than the size of the predetermined threshold value).

The buffer manager 550 may store information on a start entry and an end entry in which the target data are stored. Referring to FIG. 7B, the start entry may be '1' and the end entry may be '14'. Also, since the size of the target data is smaller than the size of one strip, the buffer manager 550 may not determine the skip value. The buffer manager 550 may provide the processor 134 with the start entry and the end entry.

The processor 134 may program the target data based on the start entry and the end entry provided from the buffer manager 550. In particular, the processor 134 may sequentially program the target data stored in the buffer 530 into the pages forming a strip. For example, the processor 134 may control the memory device 150 to program the target data stored in a first entry to a $12^{th}$ entry into the first die.

Referring to FIG. 7B, the processor 134 may program the target data in a first page in a first memory block included in the first die in the order of a first logical page (LSB), a second logical page (CSB), and a third logical page (MSB). However, this is merely one embodiment, and the scope and spirit of the present invention are not limited thereto. The processor 134 may then control the memory device 150 to program the target data stored in $13^{th}$ and $14^{th}$ entries into the second die. Herein, the processor 134 may perform a program operation on the basis of a logical page. Since the size of the target data stored in the $13^{th}$ and $14^{th}$ entries is '8 KB', the processor 134 may control the memory device 150 to program a dummy data of '8 KB' together. In short, the programming method described with reference to FIG. 7B may be a method of sequentially programming target data from the first die without using the interleaving method.

Figure 8:
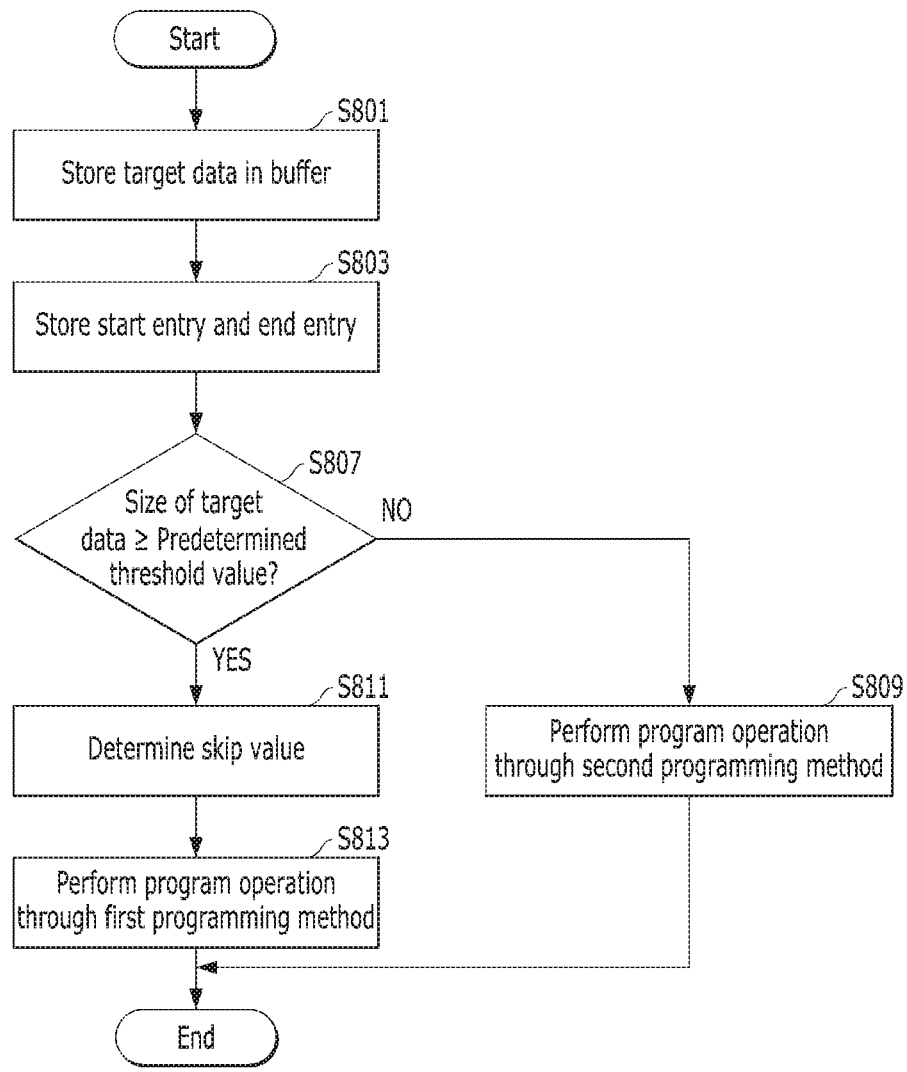
FIG. 8 is a flowchart for describing an operation of the memory system in accordance with an embodiment of the present disclosure.

FIG. 8 is a flowchart for describing an operation of the memory system 110A in accordance with an embodiment of the present invention. For the sake of convenience in explanation, the programming method described in FIGS. 6A and 7A may be referred to as a first programming method, and the programming method described in FIGS. 6B and 7B may be referred to as a second programming method.

At step S801, the processor 134 may temporarily store target data provided from the host 102 in the buffer 530 of the memory 144.

At step S803, the buffer manager 550 may store information on a start entry and an end entry of the buffer 530 to which the target data are assigned.

At step S807, the monitor 510 may compare a size of the target data with a predetermined threshold value. In an embodiment, the predetermined threshold value may be equal to the size of one strip. The size of the target data may be checked (or determined) based on a logical address (LBA) provided from the host 102.

When the size of the target data is smaller than the predetermined threshold value ('NO' in the step S807), at step S809, the processor 134 may program the target data stored in the buffer 530 into the memory device 150 through the second programming method.

On the other hand, when the size of the target data is equal to or greater than the predetermined threshold ('YES' in the step S807), at step S811, the buffer manager 550 may determine a skip value based on physical information of the memory device 150. The physical information of the memory device 150 denotes information on a super block. For example, the physical information of the memory device 150 denotes the number of dies forming the super block and the number of memory blocks related to the super block in a die.

At step S813, the processor 134 may program the target data stored in the buffer 530 into the memory device 150 based on the skip value through the first programming method.

As described above, a programming method having the advantages of both of the first programming method and the second programming method based on the size of the data of the memory system 110A in accordance with the embodiment of the present invention may be used.

Hereinafter, a data processing system and electronic devices which may be implemented with the memory system 110A including the memory device 150 and the controller 130A will be described in detail with reference to FIGS. 9 to 17.

FIGS. 9 to 17 are diagrams schematically illustrating application examples of the data processing system of FIGS. 1 to 8 according to various embodiments.

Figure 9:
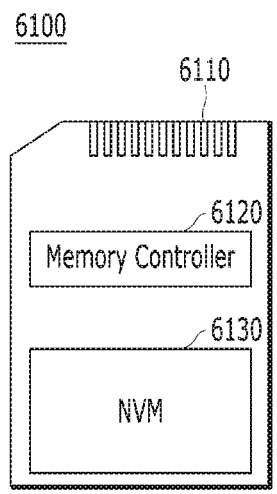
FIGS. 9 to 17 are diagrams schematically illustrating application examples of a data processing system, in accordance with various embodiments of the present invention.

FIG. 9 is a diagram schematically illustrating an example of the data processing system including the memory system in accordance with an embodiment. FIG. 9 schematically illustrates a memory card system 6100 including the memory system in accordance with an embodiment.

Referring to FIG. 9, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM).

By the way of example but not limitation, the memory controller 6120 may be configured to control read, write, erase and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130A in the memory system 110A described with reference to FIG. 5, while the memory device 6130 may correspond to the memory device 150 described with reference to FIG. 5.

Thus, as shown in FIG. 1, the memory controller 6120 may include a random access memory (RAM), a processor, a host interface, a memory interface and an error correction code component. The memory controller 6120 may further include the elements described in FIG. 1 or FIG. 5.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and a universal flash storage (UFS).

Figure 10:
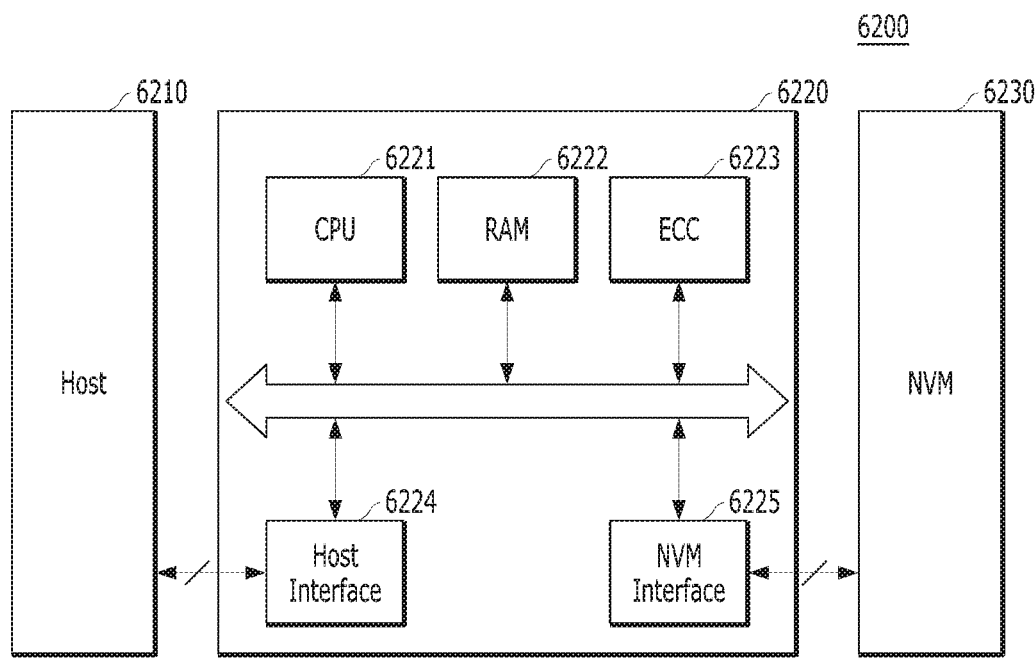

FIG. 10 is a diagram schematically illustrating another example of a data processing system 6200 including a memory system, in accordance with an embodiment.

Referring to FIG. 10, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110A described in FIG. 5, and the memory controller 6220 may correspond to the controller 130A in the memory system 110A described in FIG. 5.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit to, and/or receive from, the host 6210 data or signals through the host interface 6224, and may transmit to, and/or receive from, the memory device 6230 data or signals through the NVM interface 6225. The host interface 6224 may be connected to the host 6210 through a parallel advanced technology attachment (PATA) bus, a serial advanced technology attachment (SATA) bus, a small computer system interface (SCSI), a universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system in accordance with an embodiment may be applied to wired and/or wireless electronic devices or particularly a mobile electronic device.

Figure 11:
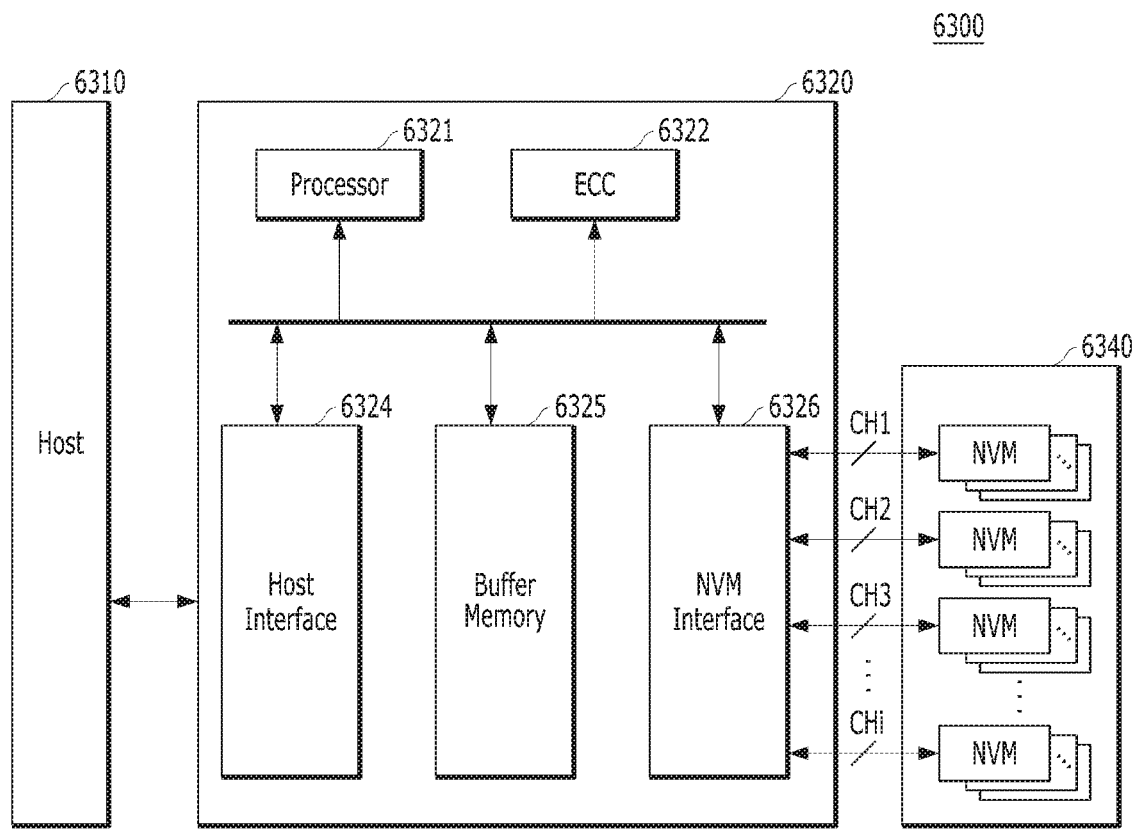

FIG. 11 is a diagram schematically illustrating another example of the data processing system including the memory system in accordance with an embodiment. FIG. 11 schematically illustrates a solid state drive (SSD) to which the memory system in accordance with an embodiment is applied.

Referring to FIG. 11, the SSD 6300 may include a controller 6320 and a memory device 6340 including a plurality of nonvolatile memories (NVMs). The controller 6320 may correspond to the controller 130A in the memory system 110A of FIG. 5, and the memory device 6340 may correspond to the memory device 150 in the memory system of FIG. 5.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 11 illustrates that the buffer memory 6325 exists in the controller 6320, but the buffer memory 6325 may be located or arranged outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110A of FIG. 5 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 12:
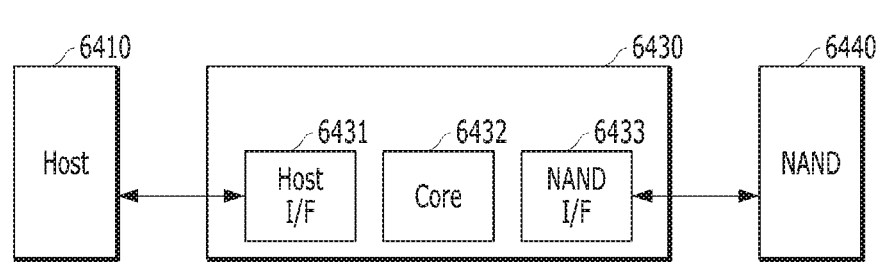

FIG. 12 is a diagram schematically illustrating another example of the data processing system including the memory system in accordance with an embodiment. FIG. 12 schematically illustrates an embedded Multi-Media Card (eMMC) 6400 to which the memory system in accordance with an embodiment is applied.

Referring to FIG. 12, the eMMC 6400 may include a controller 6430 and a memory device 6440 embodied by one or more NAND flash memories. The controller 6430 may correspond to the controller 130A in the memory system 110A of FIG. 5, and the memory device 6440 may correspond to the memory device 150 in the memory system 110A of FIG. 5.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 13 to 16 are diagrams schematically illustrating other examples of the data processing system including the memory system in accordance with an embodiment. FIGS. 13 to 16 schematically illustrate universal flash storage (UFS) systems to which the memory system in accordance with an embodiment is applied.

Referring to FIGS. 13 to 16, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices or particularly mobile electronic devices, the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices or particularly mobile electronic devices through UFS protocols. The UFS devices 6520, 6620, 6720, 6820 and the UFS cards 6530, 6630, 6730, 6830 may be embodied by the memory system 110A illustrated in FIG. 5. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 10 to 12, and the UFS cards 6530, 6630, 6730, 6830 may be embodied in the form of the memory card system 6100 described with reference to FIG. 9.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 13:
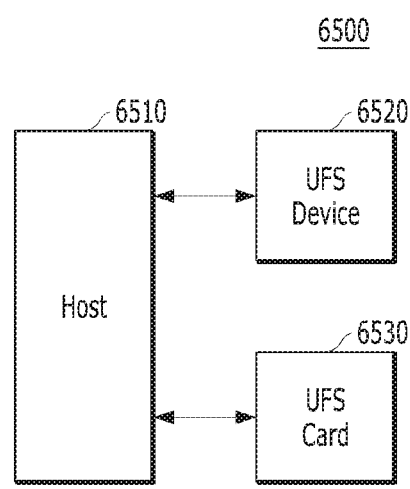

In the UFS system 6500 illustrated in FIG. 13, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. In an example, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement that a single device is coupled with plural other devices or cards for centralized control.

Figure 14:
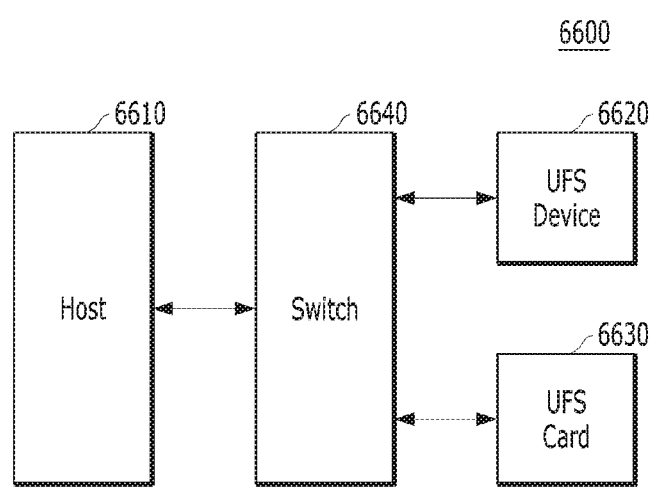

In the UFS system 6600 illustrated in FIG. 14, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an example, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 15:
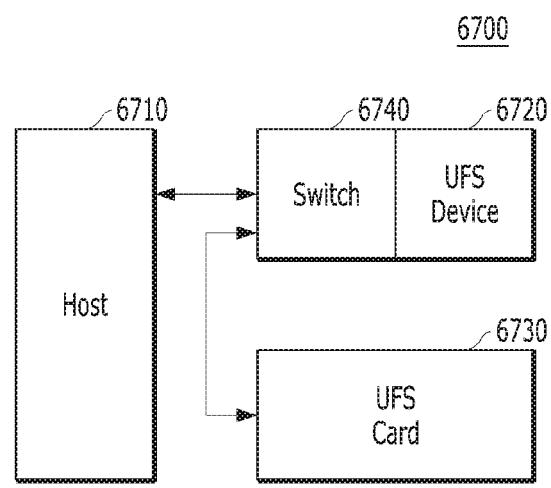

In the UFS system 6700 illustrated in FIG. 15, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an example, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 16:
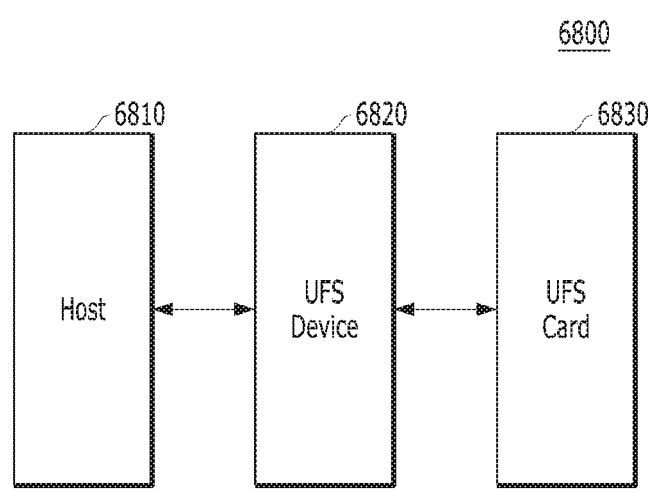

In the UFS system 6800 illustrated in FIG. 16, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 17:
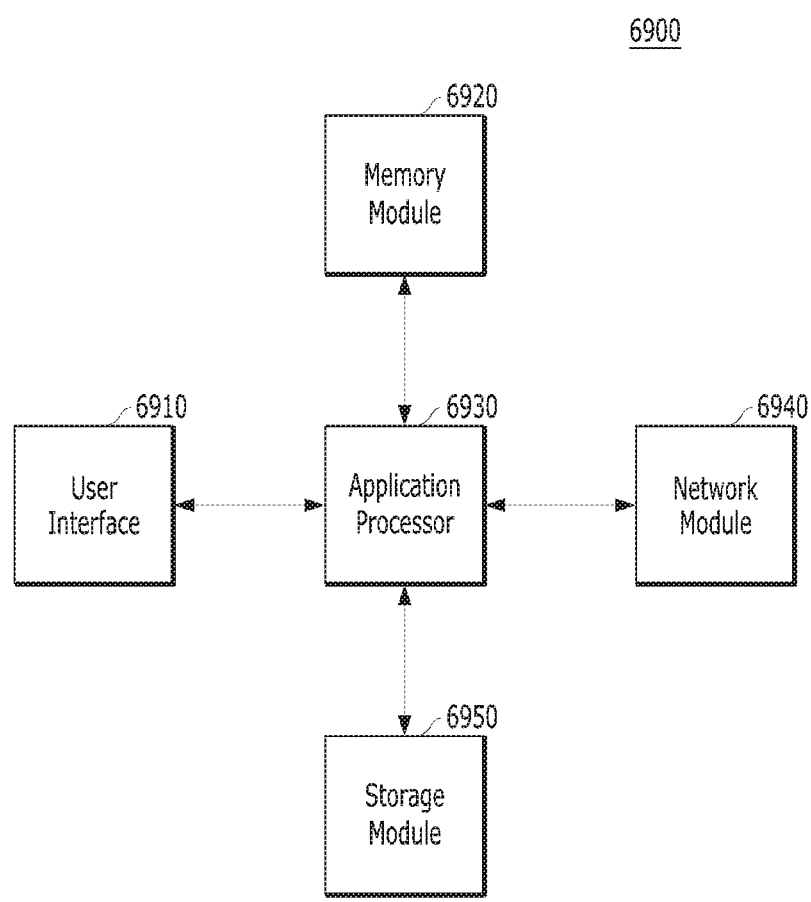

FIG. 17 is a diagram schematically illustrating another example of the data processing system including the memory system in accordance with an embodiment. FIG. 17 is a diagram schematically illustrating a user system 6900 to which the memory system in accordance with an embodiment is applied.

Referring to FIG. 17, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110A described with reference to FIG. 5. Furthermore, the storage module 6950 may be embodied as an SSD, eMMC and UFS as described above with reference to FIGS. 11 to 16.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110A of FIG. 5 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:
1. A memory system comprising:
a memory device including a plurality of dies; and
a controller suitable for controlling the memory device,
wherein the controller includes:
   a buffer including a plurality of entries suitable for temporarily storing target data;
   a monitor suitable for comparing a size of the target data with a predetermined threshold value;
   a buffer manager suitable for determining, when the size of the target data is equal to or greater than the predetermined threshold value, a skip value based on physical information of the memory device, and storing a start entry and an end entry in which the target data is stored; and
   a processor suitable for controlling the memory device to perform a program operation on the target data through an interleaving programming method based on the start entry, the end entry, and the skip value.

2. The memory system of claim 1, wherein when the size of the target data is smaller than the predetermined threshold value, the buffer manager stores the start entry and the end entry, and
the processor controls the memory device to perform a program operation on the target data through a sequential programming method based on the start entry and the end entry.

3. The memory system of claim 2, wherein when the program operation is performed through the sequential programming method, the target data is programmed into the plurality of dies of the memory device according to a predetermined programming order.

4. The memory system of claim 1, wherein the physical information of the memory device includes the number of dies forming a super block and the number of blocks related to a super block in one die.

5. The memory system of claim 1, wherein the predetermined threshold value is a size of one strip included in the super block,
wherein the strip denotes a group of physical pages positioned at the same offset in the same super block.

6. The memory system of claim 1, wherein the processor assigns the target data to the plurality of entries of the buffer.

7. The memory system of claim 1, wherein each of the plurality of entries has the same size as a size of one physical page or a size of one logical page in the memory device.

8. The memory system of claim 1, wherein the size of the target data is determined based on a logical address corresponding to the target data.

9. A method for operating a memory system with a controller and a memory device including a plurality of dies, the method comprising:
temporarily storing target data into a plurality of entries included in a buffer;
storing a start entry and an end entry in which the target data is stored, among the plurality of entries;
comparing a size of the target data with a predetermined threshold value;
determining a skip value based on physical information of the memory device when the size of the target data is equal to or greater than a predetermined threshold value; and
programming the target data through a interleaving programming method based on the start entry, the end entry, and the skip value.

10. The method of claim 9, further comprising:
programming, when the size of the target data is smaller than the predetermined threshold, the target data through a sequential programming method based on the start entry and the end entry.

11. The method of claim 10, wherein in the programming of the target data through the sequential programming method,
the target data is programmed into plurality of dies according to a predetermined programming order.

12. The method of claim 9, wherein the physical information of the memory device includes the number of dies forming a super block and the number of blocks related to a super block in one die.

13. The method of claim 9, wherein the predetermined threshold value is a size of one strip included in the super block,
wherein the strip denotes a group of physical pages positioned at the same offset in the same super block.

14. The method of claim 9, wherein further comprising:
assigning the target data to the plurality of entries of the buffer.

15. The method of claim 14, wherein each of the entries has the same size as a size of one physical page or a size of one logical page in the memory device.

16. The method of claim 9, wherein the size of the target data is determined based on a logical address corresponding to the target data.

17. A memory system comprising:
a memory device including a plurality of dies; and
a controller suitable for controlling the memory device, wherein the controller includes:
a plurality of entries suitable for temporarily storing target data to be programmed into the plurality of dies of the memory device;
a monitor suitable for determining a size of the target data;
a buffer manager suitable for storing a start entry and an end entry in which the target data is stored; and
a processor suitable for controlling the memory device to perform a program operation on the target data through an interleaving programming method or a sequential programming method based on the start entry, the end entry.

18. The memory system of claim 17, wherein when the size of the target data is equal to or greater than a predetermined threshold value,
the buffer manager determines a skip value based on the number of dies forming a super block and the number of blocks related to a super block in one die; and
the processor controls the memory device to perform a program operation on the target data through the interleaving programming method.

19. The memory system of claim 17, wherein when the size of the target data is smaller than a predetermined threshold value,
the buffer manager stores the start entry and the end entry, and
the processor controls the memory device to perform a program operation on the target data through the sequential programming method based on the start entry and the end entry.

20. The memory system of claim 17, wherein
each of the plurality of entries has the same size as a size of one physical page or a size of one logical page in the memory device.

* * * * *